United States Patent [19]
Bastani et al.

[11] Patent Number: 6,157,822
[45] Date of Patent: Dec. 5, 2000

[54] TUNED LOW POWER/LOW NOISE MIXER

[75] Inventors: Babak Bastani, Weston; Kenneth D. Cornett, Coral Springs, both of Fla.

[73] Assignee: Motorola, Inc., Schaumburg, Ill.

[21] Appl. No.: 09/349,836

[22] Filed: Jul. 8, 1999

[51] Int. Cl.[7] .................................................... H04B 1/16
[52] U.S. Cl. ........................ 455/323; 455/326; 455/333; 455/292
[58] Field of Search ................................. 455/292, 293, 455/313, 323, 324, 325, 326, 327, 328, 329, 330, 333; 327/113, 115, 117, 118, 355, 356, 359; 323/315; 330/252; 333/32, 34

[56] References Cited

U.S. PATENT DOCUMENTS

| | | | |
|---|---|---|---|
| 3,727,078 | 4/1973 | Wollesen | 327/113 |
| 4,636,663 | 1/1987 | Jongepier et al. | |
| 5,513,390 | 4/1996 | Vice | 455/323 |
| 5,521,545 | 5/1996 | Terry et al. | 327/113 |
| 5,825,231 | 10/1998 | Chevallier et al. | 327/356 |
| 5,884,154 | 3/1999 | Sano et al. | 455/333 |
| 6,026,286 | 2/2000 | Long | 455/333 |
| 6,094,571 | 7/2000 | Groe | 455/333 |

OTHER PUBLICATIONS

Abou–Allam, E., El–Masry, E.I., and Manku, T., "CMOS Front End RF Amplifier with On–Chip Tuning," IEEE 1996.

*Primary Examiner*—Nguyen Vo
*Assistant Examiner*—Lester G. Kincaid
*Attorney, Agent, or Firm*—Frank M. Scutch, III

[57] ABSTRACT

A tuned low noise mixer (200) for use in radio frequency (RF) communications includes a transconductance amplifier (203) for amplifying an RF input signal (201). An impedance matching network (207) is formed using an impedance matching transformer with a tap connection (207') between primary and secondary coils. A mixer circuit (209) is then used for mixing a local oscillator signal (211) with the output of the impedance matching network (207) while a load network (213) provides a load to an output (215) of the mixer circuit (209). The invention provides a novel RF mixer topology that has a substantially low noise figure and a proportionally large power gain with low current drain for eliminating the need for an low noise amplifier (LNA) commonly used in RF mixer circuitry.

11 Claims, 4 Drawing Sheets

TUNED LOW POWER/LOW NOISE MIXER

TECHNICAL FIELD

This invention relates in general to low power and low noise radio frequency (RF) mixer circuits.

BACKGROUND

In most radio frequency (RF) communications receivers, it is necessary to mix the RF signal to a low frequency intermediate frequency (IF) signal to perform signal processing and demodulation. This function is performed by a down mixer which uses well known heterodyne principals to mix a RF signal to some lower frequency. Typically in modern day communications equipment, this is accomplished with either a Gilbert Cell mixer or a diode mixer.

As seen in prior art FIGS. 1 and 2, a Gilbert Cell mixer is illustrated wherein an RF input signal 101 is fed to a RF input transconductor amplifier 103 such as a differential pair. The RF signal is amplified and then input to a mixer 105 formed by a plurality of switching devices. The mixer 105 works to provide sum and difference RF signals based on the frequency of the input signals from RF input transconductor amplifier 103 and the local oscillator (LO) input signals 107. With proper application of a differential load 109 and the voltage supply 111, the resultant output signals are provided at the output 113.

Although the typical Gilbert mixer 150 shown in prior art FIG. 2 is commonly used, this circuit performs the mixing function at some cost and inefficiency. Namely, the noise figure of this type of mixer is typically very high and is commonly between 8 dB to 10 dB at 800 Mhz. This high noise figure occurs because the RF Input Transconductor amplifier 103 does not have a substantially large power gain to overcome the noise figure of the switching devices. This limited gain is due to the large impedance mismatch between the RF transconductor amplifier 103 and the switch devices present in the mixer 105. As a result, the mixer 105 must use a low noise amplifier (LNA) in a stage preceding the mixer which ultimately consumes more power and degrades the third order input intercept point of the mixer 105. In the instance where this circuit is used as a RF receiver front end, it creates more receiver noise and higher current drain contributing to the overall inefficiency of the circuit. Typical prior art mixer circuits are disclosed in U.S. Pat. No. 5,884,154 and U.S. Pat. No 4,636,663 and are both herein incorporated by reference.

Thus, the need exists to provide a RF mixer topology that has a substantially low noise figure and with a proportionally large power gain and low current drain for eliminating the need for an LNA commonly used in RF mixer circuitry.

DETAILED DESCRIPTION OF THE PREFERRED EMBODIMENT

Figure 1:
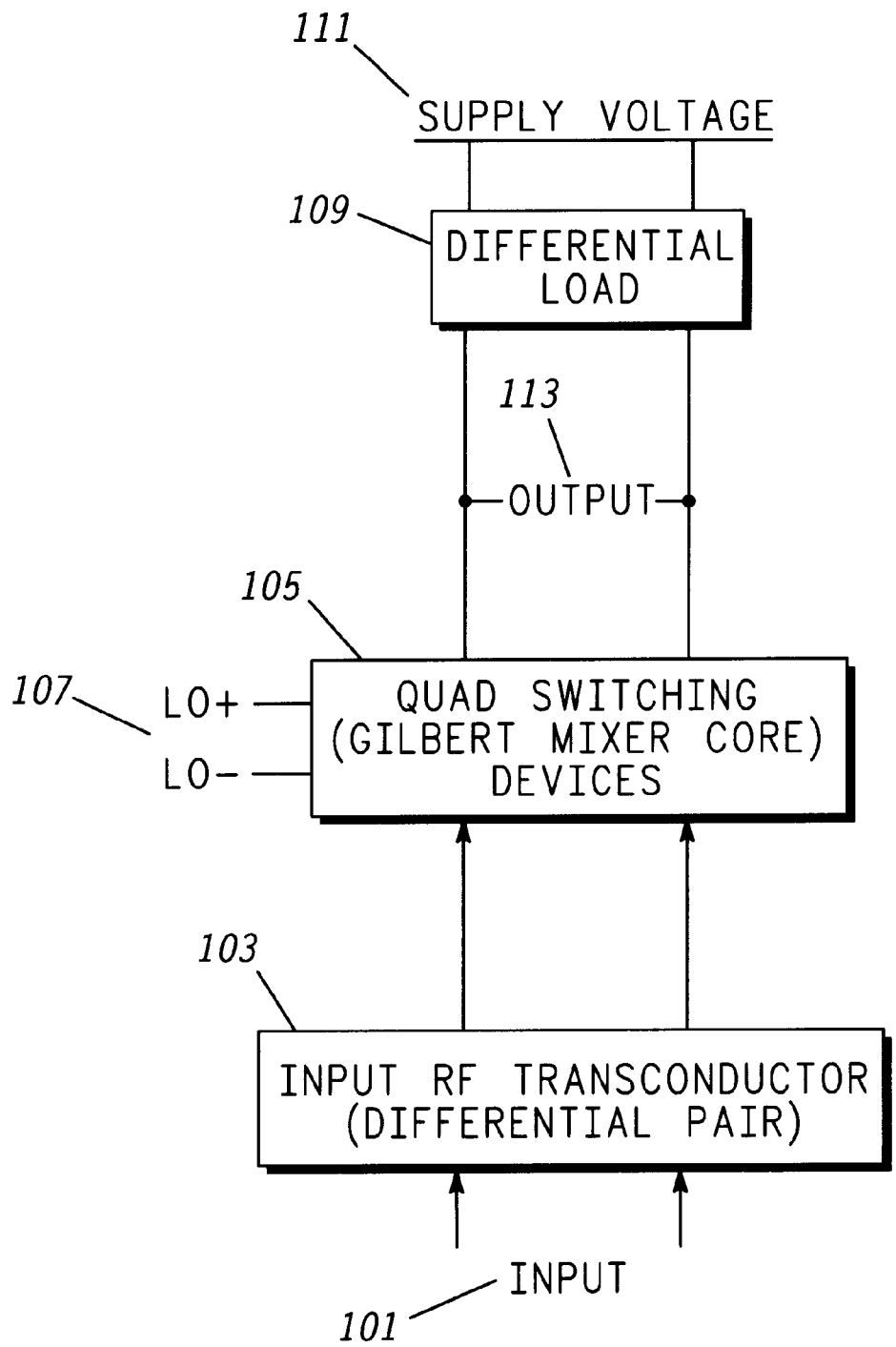
FIG. 1 is a prior art block diagram showing typical mixer topology.
Figure 2:
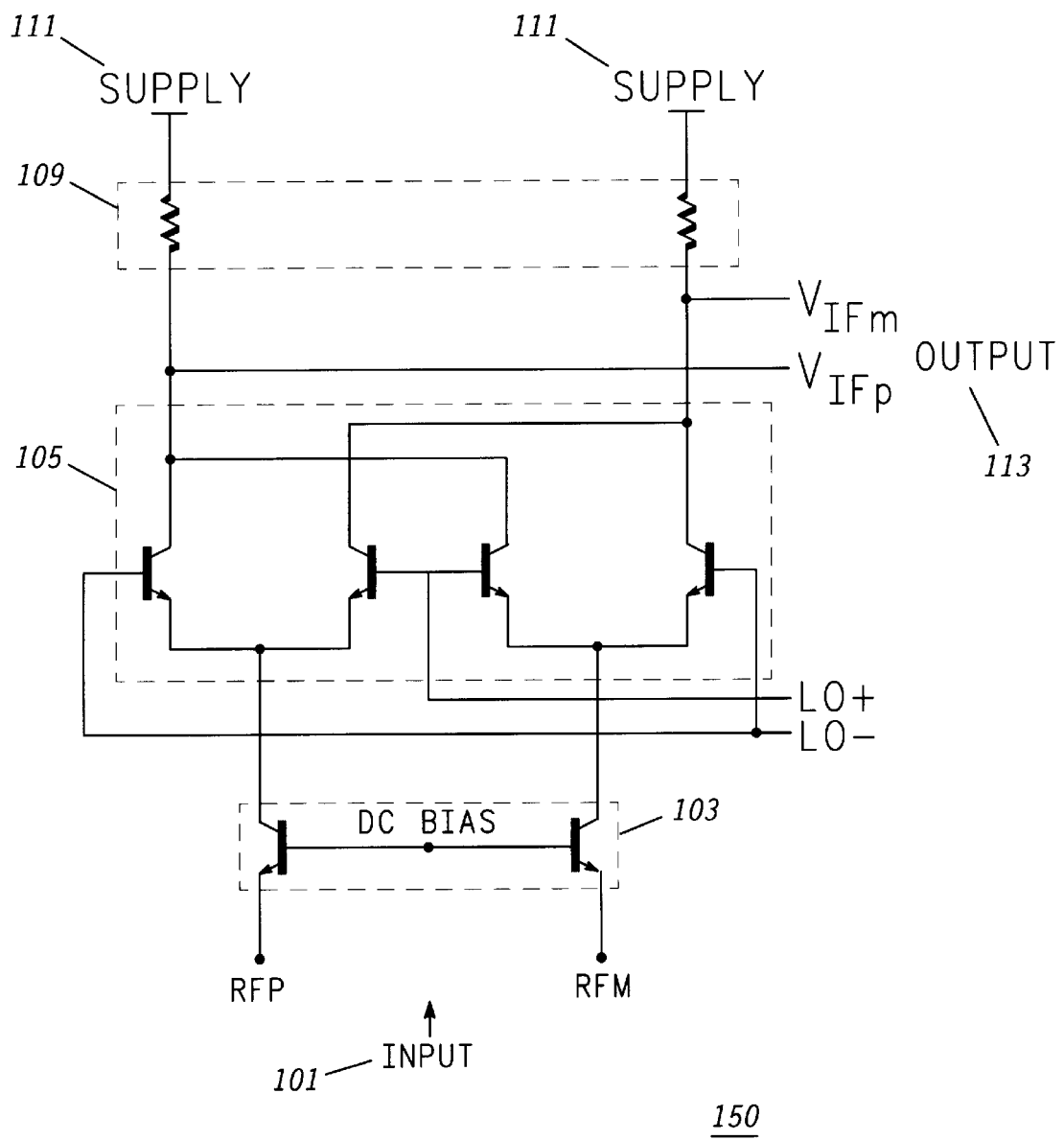
FIG. 2 is a prior art circuit diagram showing a typical Gilbert cell mixer.
Figure 3:
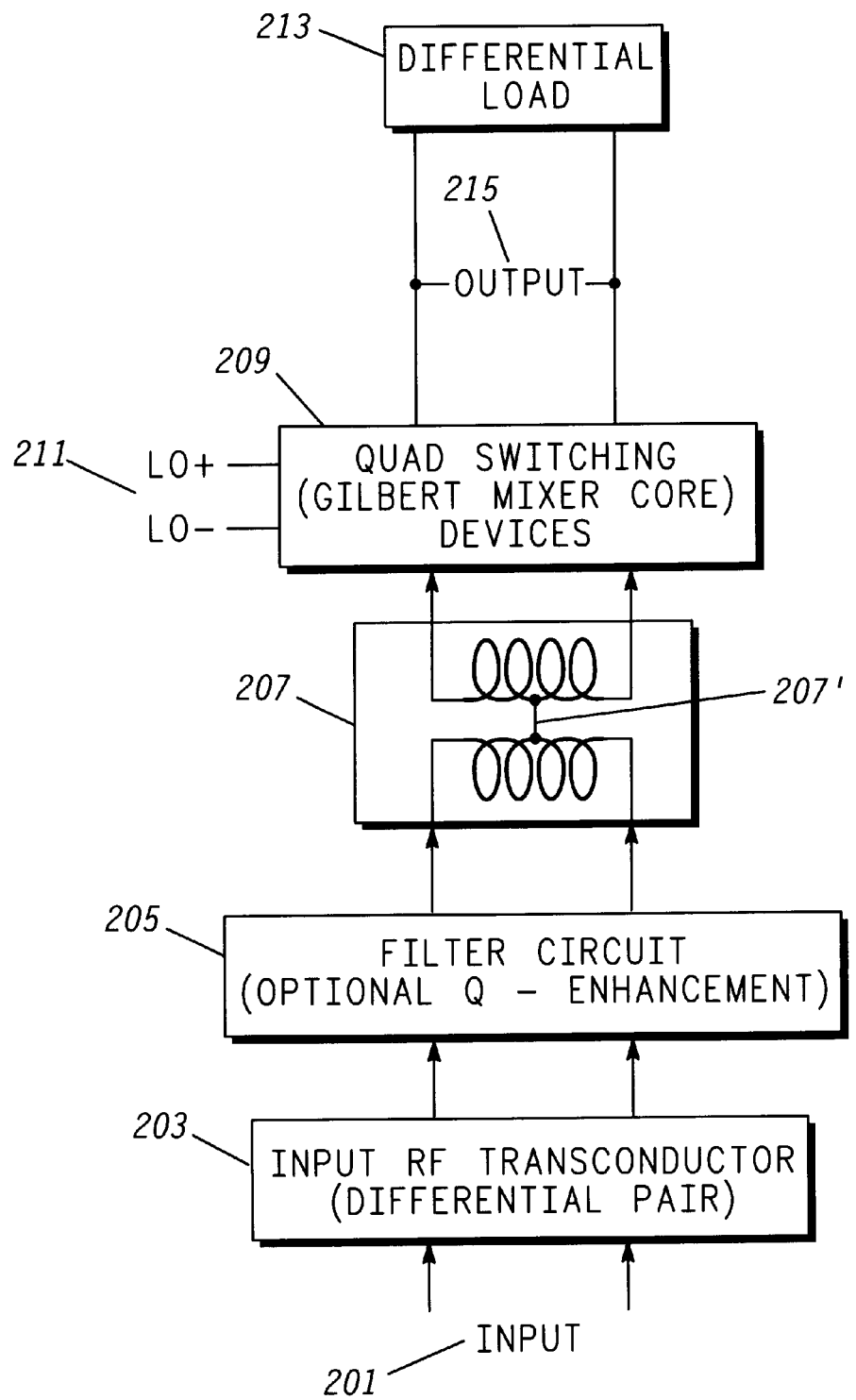
FIG. 3 is a block diagram showing a tuned low power/low noise mixer in accordance with the preferred embodiment of the invention.

Referring now to FIG. 3, the tuned low power/low noise mixer 200 of the present invention includes an RF input 201 that is input to an RF input transconductor amplifier 203 that typically uses some type of differential semiconductor pair forming the amplifier. It will be recognized by those skilled in the art that the output of the transconductor amplifier 203 will have a substantially high output impedance as compared with the substantially low input impedance required to match the input of the mixer 209. The output of the transconductor amplifier 203 may sometimes include unwanted signal components amplified from the input as a result of wideband amplification process. These unwanted signal components are substantially eliminated through the use of a LC filter circuit 205, which may be comprised of the combination of a capacitor and the primary windings of the transformer. The quality factor (Q) of the RF transformer can also be increased through the use of Q-Enhancement circuits known in the prior art. (CMOS Front End RF Amplifier with On-Chip Tuning, by E. Abou-Allam et al. 1996 IEEE).

In order to efficiently match the output impedance of the transconductance amplifier 203 to the input impedance of the mixer 209 an impedance matching circuit 207 is used. It will be evident to those skilled in the art, that the impedance matching circuit includes an efficient matching transformer 207 that can be an air wound transformer, or can be manufactured from discrete circuit components or an integrated spiral inductor built on a semiconductor substrate depending on space and circuit requirements. In the preferred embodiment of the invention, the impedance matching transformer 207 has a spiral inductor core unique in that it not only includes a plurality of turns on its primary and secondary coils to match the impedance but also utilizes a primary to secondary tap connection 207'. This tap connection 207' acts to supply a direct current (DC) feed in order to re-use the DC current in both primary and secondary transformer windings. This allows the use of only one current source without the need for separate current sources. The tap connection is precisely calculated to connect both primary and secondary of the matching transformer in order to provide the desired DC current to the transformer secondary.

After the low impedance of the RF input transconductor amplifier 203 is converted to substantially higher impedance, the RF input signal is input to the mixer 209. As is well known in the art, this may be a quadrature switching Gilbert core mixer or the like. The RF input signal is mixed with the appropriate local oscillator (LO) high or low input signal 211. A resultant signal from the mixer 209 is then applied to a differential load 213 where it can then used at its output 215.

Figure 4:
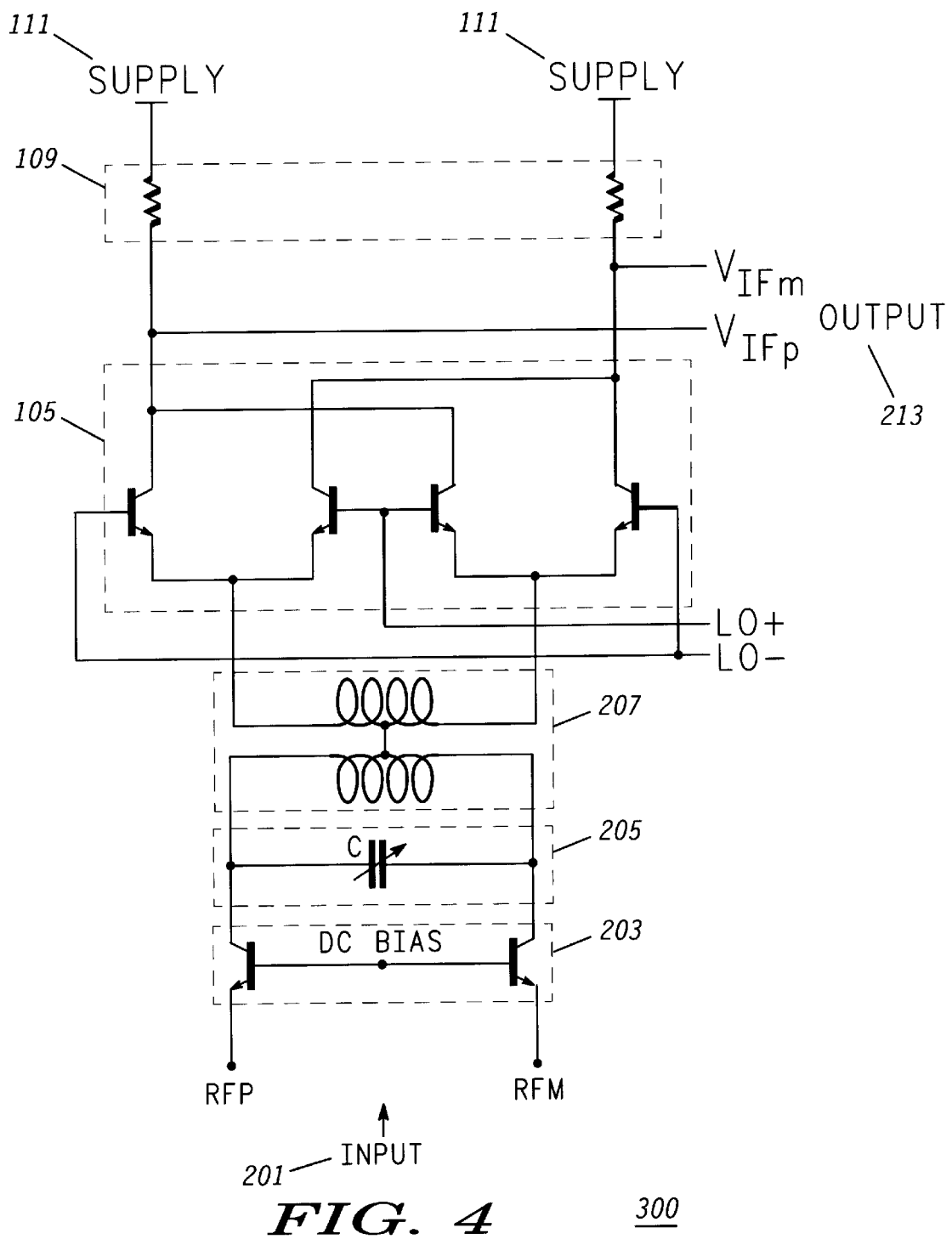
FIG. 4 is a prior art circuit diagram showing the tuned low power/low noise mixer as shown in FIG. 3.

As seen in FIG. 4, an example of a tuned low power/low noise mixer circuit 300 includes a differential pair RF transconductor amplifier 203, an LC filter circuit 205 including a variable capacitor (or a fixed switched capacitor) and the primary windings of the transformer for center frequency tuning, an impedance matching transformer 207 including a primary to secondary tap connection with a mixer circuit 209 configured as a Gilbert mixer for accepting the RF input 201 as well as that from the local oscillator (LO) 211. A differential load 211 loads the output 213 where the resultant mixed output may be obtained.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A tuned low noise mixer for use in radio frequency (RF) communications comprising:
   - a transconductance amplifier for amplifying an RF input signal;
   - an impedance matching network formed using an impedance matching transformer with a tap connection between primary and secondary coils;
   - a mixer circuit for mixing a plurality of RF input signals; and
   - a load network for providing a load to an output of the mixer circuit.

2. A tuned low noise mixer as in claim 1, further comprising a filter circuit for filtering the output of the transconductance amplifier.

3. A tuned low noise mixer as in claim 2, wherein the filter circuit is comprised of at least one capacitor used in combination with the primary windings of the impedance matching transformer for frequency tuning.

4. A tuned low noise mixer as in claim 3, wherein the at least one capacitor is a variable capacitor.

5. A tuned low noise mixer amplifier system for use in an radio frequency (RF) communications receiver comprising:
   - a transconductance amplifier comprising a semiconductor differential pair for amplifying an RF input signal;
   - a filter circuit removing undesired signal components from the input signal;
   - a mixer circuit for providing resultant signals for a plurality of RF input signals;
   - a differential load network for providing a load impedance to an output of the mixer circuit; and
   - wherein an impedance matching network utilizing a impedance matching transformer with a physically interconnected primary and secondary winding matches the output impedance of the transconductance amplifier to the input of the mixer circuit.

6. A tuned low noise mixer amplifier system as in claim 5, wherein the transconductance amplifier comprises at least one semiconductor differential pair.

7. A tuned low noise mixer amplifier system as in claim 6, wherein the filter circuit includes at least one variable capacitor used in combination with the primary windings of the impedance matching transformer.

8. A tuned low noise mixer system as in claim 6, wherein the filter circuit includes a Q-Enhancement circuit to improve the quality factor of the transformer.

9. A tuned low noise mixer amplifier system as in claim 5, wherein the mixer circuit is a quadrature switching Gilbert core mixer.

10. A method for matching the output impedance of a radio frequency (RF) transconductor amplifier to the input impedance of an RF Gilbert mixer circuit comprising the steps of:
    - providing an impedance matching transformer having a primary and secondary winding for inductively coupling the respective coils to change the matching impedance of an RF input signal; and
    - shorting the primary and secondary coils using a shorting stub for re-using the direct current (DC) current between the Gilbert mixer circuit and the input transconductor amplifier.

11. A method for matching the output impedance of an RF transconductor amplifier to the input impedance of an RF mixer circuit as in claim 10, further comprising the step of:
    - filtering the output of the transconductor amplifier with a filter circuit for removing wanted signal components before inputting the RF input signal to the impedance matching transformer.

* * * * *